(12) United States Patent
Huang et al.

(10) Patent No.: US 8,504,883 B2
(45) Date of Patent: Aug. 6, 2013

(54) SYSTEM AND METHOD FOR TESTING INTEGRATED CIRCUITS

(75) Inventors: Yin-Chin Huang, Zhubei (TW); Chu Pang Huang, Hsinchu (TW)

(73) Assignee: Macronix International Co., Ltd. (TW)

( * ) Notice: Subject to any disclaimer, the term of this patent is extended or adjusted under 35 U.S.C. 154(b) by 506 days.

(21) Appl. No.: 12/868,263

(22) Filed: Aug. 25, 2010

(65) Prior Publication Data

US 2012/0054565 A1  Mar. 1, 2012

(51) Int. Cl.
*G11C 29/00* (2006.01)

(52) U.S. Cl.
USPC ........................................................ 714/719

(58) Field of Classification Search
USPC ........................................................ 714/719
See application file for complete search history.

(56) References Cited

U.S. PATENT DOCUMENTS

| | | | | |
|---|---|---|---|---|
| 5,696,773 A | | 12/1997 | Miller | |
| 5,706,234 A | * | 1/1998 | Pilch, Jr. et al. | 365/201 |
| 5,892,721 A | * | 4/1999 | Kim | 365/201 |
| 5,926,424 A | * | 7/1999 | Abe | 365/201 |
| 5,991,903 A | * | 11/1999 | Shin et al. | 714/718 |
| 6,055,653 A | * | 4/2000 | LeBlanc et al. | 714/718 |
| 6,539,505 B1 | * | 3/2003 | Dahn | 714/718 |
| 6,556,034 B1 | | 4/2003 | Johnson et al. | |
| 6,591,384 B1 | * | 7/2003 | Chou | 714/718 |
| 6,762,599 B1 | | 7/2004 | Miller | |
| 6,867,578 B1 | | 3/2005 | Miller | |
| 7,005,867 B2 | | 2/2006 | Hashimoto | |
| 7,028,213 B2 | * | 4/2006 | Majni et al. | 714/5.1 |
| 7,042,239 B1 | | 5/2006 | Miller | |
| 2007/0220380 A1 | | 9/2007 | Ohanyan | |
| 2009/0267628 A1 | | 10/2009 | Takase | |

* cited by examiner

*Primary Examiner* — Stephen M Baker
(74) *Attorney, Agent, or Firm* — Baker & McKenzie LLP

(57) ABSTRACT

A method of testing a semiconductor memory device includes reading previously written test data from the semiconductor memory device simultaneously through at least two data I/O connections, e.g., pins or pads, of the semiconductor memory device. The signals from the two data I/O connections are combined to produce a compound output signal. The compound output signal is received by a single I/O channel of a tester. The tester compares the compound output signal to a predetermined voltage level, and determines whether the semiconductor memory device is operating properly based on the comparison of the compound output signal to the predetermined voltage level.

18 Claims, 7 Drawing Sheets

SYSTEM AND METHOD FOR TESTING INTEGRATED CIRCUITS

RELATED APPLICATIONS AND PRIORITY CLAIM

This application is related to U.S. application Ser. No. 12/797,786, filed Jun. 10, 2010 which is herein incorporated by reference in its entirety for all purposes.

BACKGROUND

1. Technical Field

The present application relates to the testing of integrated circuits, including the testing of memory devices.

2. Related Art

The manufacturing of integrated circuits involves processing a wafer through a series of fabrication steps in order to fabricate multiple integrated circuits on the wafer. Once the wafer has been processed, the wafer is cut into individual integrated circuits, which can then undergo further processing involving various bonding and packaging steps. However, it is desirable to test the operation of the integrated circuits before use. In some cases, the integrated circuits can be tested before the wafer is cut. Additionally or alternatively, the integrated circuits can be tested after the bonding and packaging steps. Such tests are typically made in order to verify various electrical properties of the integrated circuits. The information from these tests can be fed into a computer, which compares the test results with information stored in its memory, and render a decision regarding the acceptability of the integrated circuit.

Since integrated circuits are tested individually, testing is a time consuming process. Thus, considerable effort has been put into improving the efficiency of the testing process. However, despite such efforts, there remains a need for further improvement in the efficiency of the testing of integrated circuits.

SUMMARY

[To be completed after claims have been finalized]

BRIEF DESCRIPTION OF THE DRAWINGS

Features, aspects, and embodiments of the inventions are described in conjunction with the attached drawings, in which.

DETAILED DESCRIPTION

Figure 1:
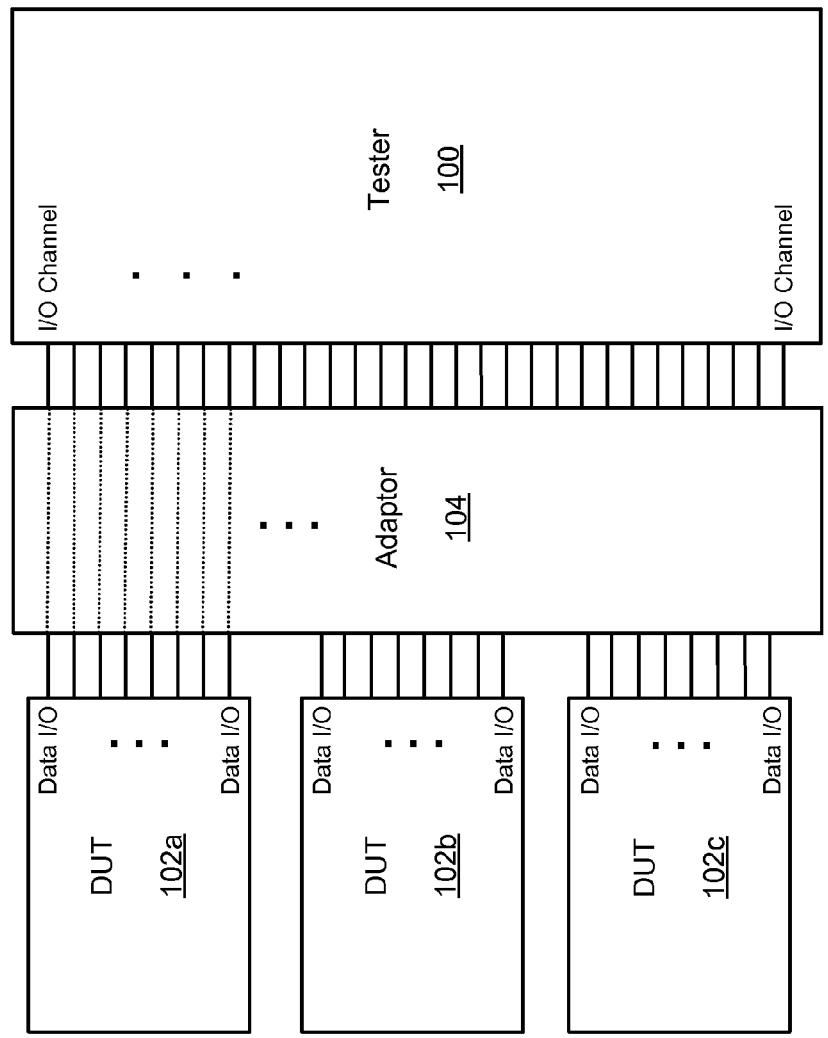
FIG. 1 shows a block diagram of a one-to-one configuration for testing semiconductor memory devices.

FIG. 1 shows a block diagram of a configuration for testing multiple semiconductor devices, where each semiconductor device being tested is referred to as a device under test (DUT). Each DUT may be, for example, a semiconductor memory device that includes a plurality of memory cells each capable of storing respective bits of data. Each semiconductor memory device may be configured according to known practices to include one or more pads or pins for data input/output (I/O), power, clock, and address data. Testing of such a semiconductor memory device can include writing data to the memory cells, and then reading the thus written data from the memory cells, and determining whether the read data matches the written data. There are many known semiconductor memory testers that can be used for such testing of semiconductor memory devices.

As shown in FIG. 1, a conventional tester 100 can be used to simultaneously test multiple DUT's 102a-102c. An adaptor 104 can be used to serve as an interface between the tester 100 and the DUT's 102a-102c. The adaptor 104 can be a passive device that allows for the tester 100 to be electrically connected to DUT's 102a-102c by providing one-to-one routing from each DUT data I/O pin to a respective tester I/O channel. The I/O channels of the tester 100 are used to write and read data to memory cells of the DUT via respective I/O pins of the DUT. Since the tester has a limited number of I/O channels that are connected on a one-to-one basis with data I/O pins of DUT's, there is a limited number of DUT's that can be connected to the tester 100 at any given time. So, for example, if the tester 100 has 640 I/O channels, and each DUT has 16 data I/O pins, the maximum number of DUT's that can be connected to the tester 100 at any given time is 640/16=40 from the standpoint of I/O resources. Thus, using the configuration shown in FIG. 1, where the tester 100 has 640 I/O channels and each DUT has 16 data I/O pins, only 40 DUT's can be tested in parallel.

Figure 2:
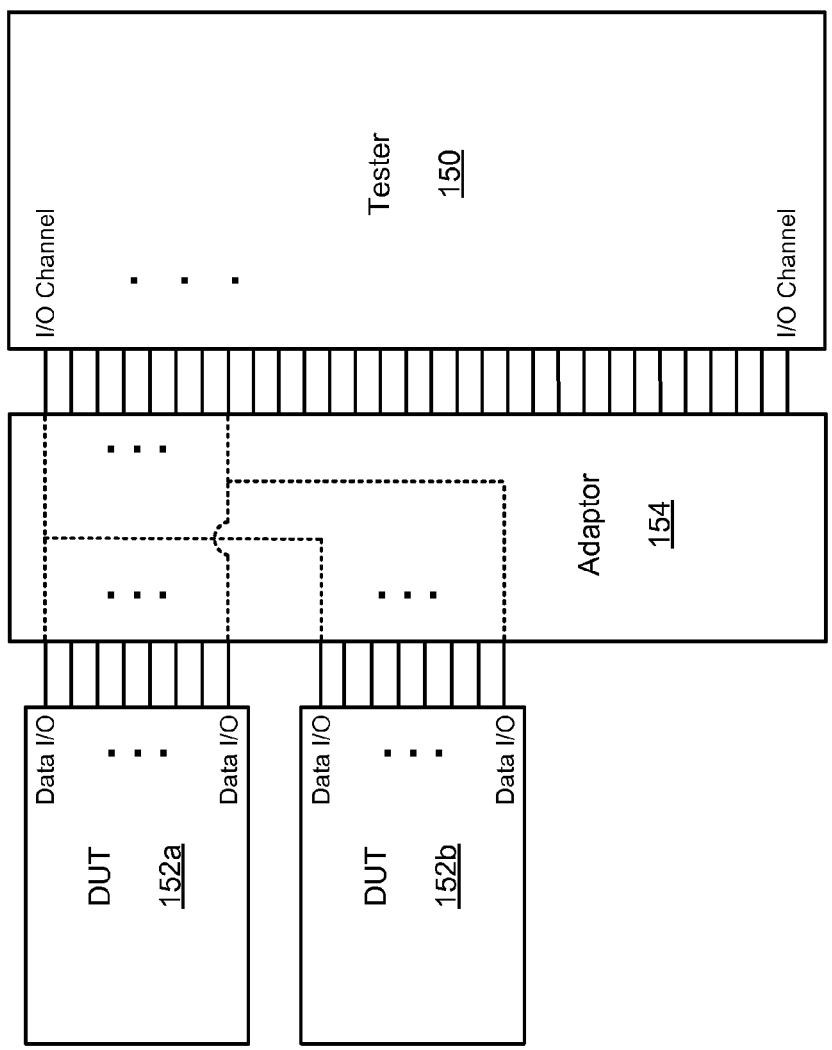
FIG. 2 shows a block diagram of a configuration for testing semiconductor memory devices where two DUT's are connected to each I/O channel of a tester.

In order to increase the number of DUT's that can be simultaneously tested, multiple DUT's can be connected to each I/O channel of the semiconductor memory tester. FIG. 2 shows a block diagram illustrating such a configuration. As shown in FIG. 2, first and second DUT's 152a and 152b are both connected to common I/O channels of a tester 150 via connections provided in an adaptor 154. More specifically, each of the first and second DUT's 152a and 152b includes a same number of data I/O pins. Each I/O channel of the tester 150 is connected to both a data I/O pin of the first DUT 152a, and a data I/O pin of the second DUT 152b.

The configuration shown in FIG. 2 advantageously allows for parallel testing of twice as many DUT's 152 per I/O channel of the tester 150 as compared with the configuration shown in FIG. 1. Thus, the time required for testing a large group of semiconductor memory devices may be decreased. However, the configuration shown in FIG. 2 can result in a certain level of overkill, reducing the overall yield. The overkill issue is summarized in Table 1:

TABLE 1

|  | DUT1 | DUT2 | Result | Remark |
| --- | --- | --- | --- | --- |
| Condition 1 | Pass | Pass | Pass |  |
| Condition 2 | Fail | Pass | Fail | Overkill |
| Condition 3 | Pass | Fail | Fail | Overkill |
| Condition 4 | Fail | Fail | Fail |  |

As shown in Table 1, there are four possible outcomes when testing multiple DUT's in parallel according to the configuration shown in FIG. 2 where each I/O channel of the tester 150 is connected to data I/O pins of both DUT's 152a and 152b. The first condition (Condition 1) corresponds to a situation where both DUT's pass the test. For example, a predetermined data pattern was written and subsequently read from the memory of both DUT's 152a and 152b. As a result, the tester 150 issues a Pass result for the pair of DUT's 152a and 152b. A fourth condition (Condition 4) corresponds to a situation where both DUT's fail the test. For example, both DUT's failed to return the same data that was written to the memories of the DUT's. As a result, the tester 150 issues a Fail result for the pair of DUT's 152a and 152b. The conditions 1 and 4 thus provide expected and appropriate results.

However, Condition 2 and Condition 3 present overkill problems. Condition 2 corresponds to a situation where the first DUT 152a fails the test, but the second DUT 152b passes the test. Condition 3 corresponds to a situation where the first DUT 152a passes the test, but the second DUT 152b fails the test. In both cases, the tester 150 sees an incorrect response from the commonly-connected DUT's 152a and 152b, and returns a Fail result for the pair of DUT's. Thus, for Conditions 2 and 3, one of the two DUT's will be incorrectly identified as a failed device.

Figure 3:
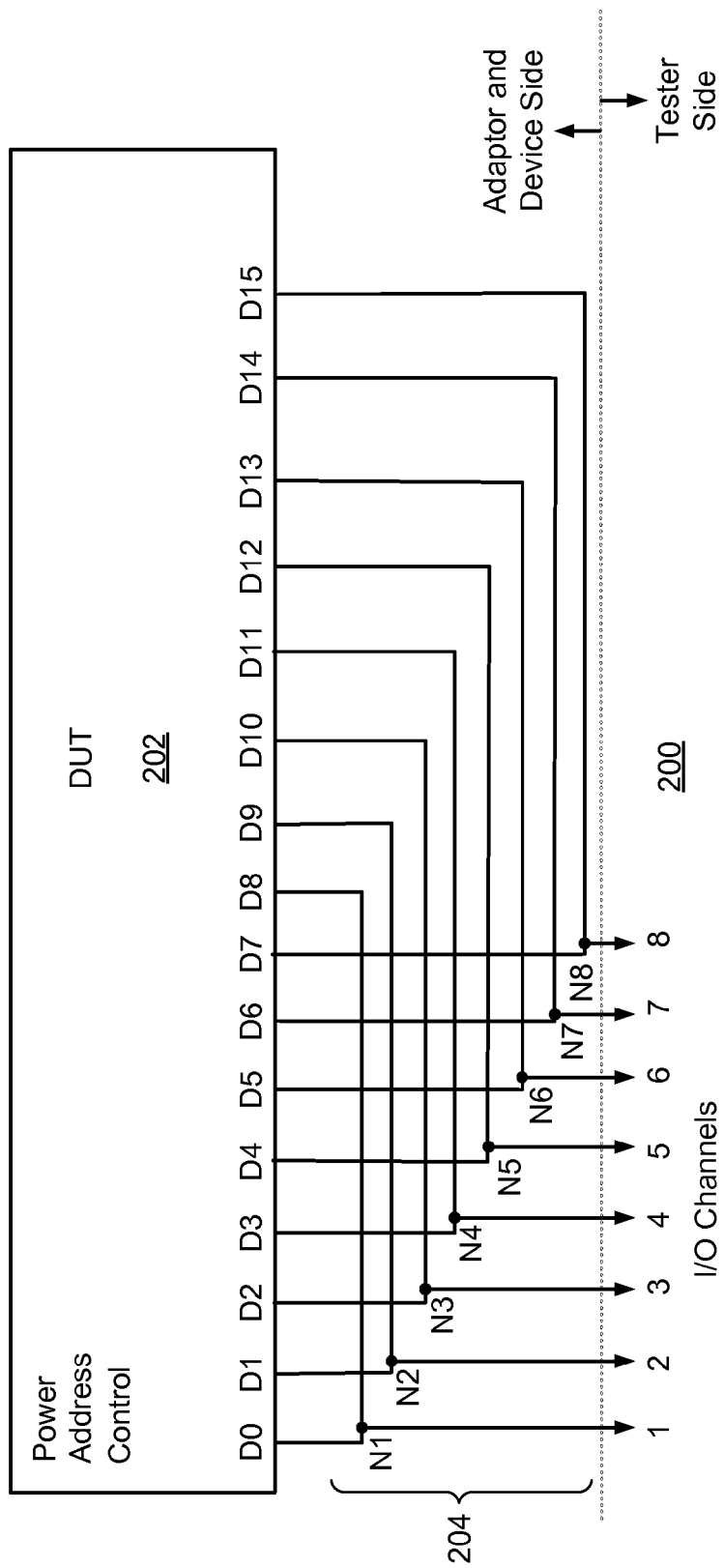
FIGS. 3 and 4 show block diagrams of a configuration for testing semiconductor memory devices where two pins of one DUT are connected to each I/O channel of a tester.
Figure 4:
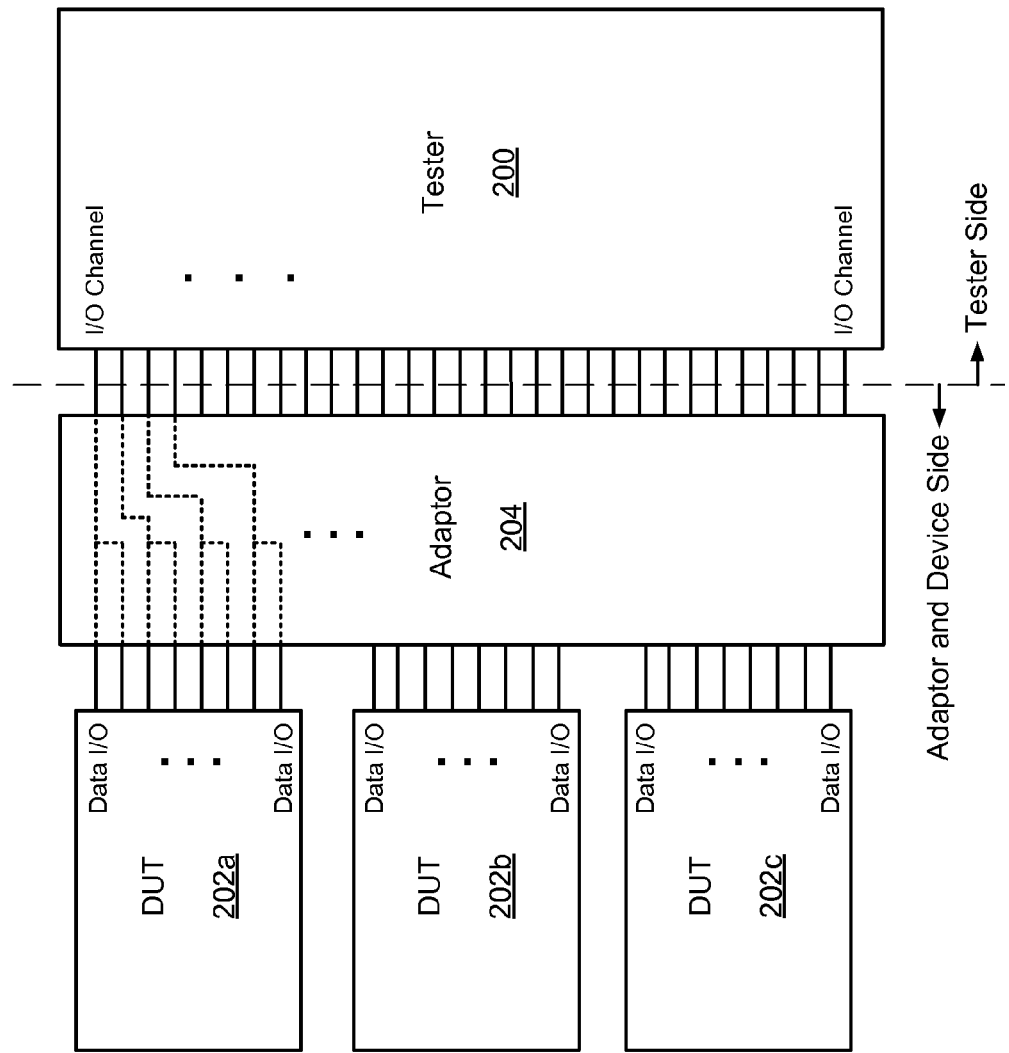

Turning next to FIGS. 3 and 4, an alternative configuration is shown that allows for connecting a semiconductor tester 200 to twice as many DUT's as compared with the configuration of FIG. 1. Each I/O channel of the semiconductor tester 200 is connected to two data I/O pins of a single DUT 202 via an adaptor 204. In the example shown, each I/O channel of the tester 200 is connected to a respective pair of data I/O pins D(n) and D(n+8). For example, I/O channel 1 is connected to data I/O pins D0 and D8, I/O channel 2 is connected to data I/O pins D1 and D9, and so on. Alternatively, each I/O channel of the tester 200 can be connected to a respective pair of data I/O pins D(n) and D(15−n). For example, I/O channel 1 can be connected to data I/O pins D0 and D15, I/O channel 2 can be connected to data I/O pins D1 and D14, and so on. As another alternative, each I/O channel of the tester 200 can be connected to a respective pair of data I/O pins D(n) and D(m), where n and m are integers, meaning that each I/O channel of the tester 200 is connected to a respective pair of data I/O pins without following any particular pattern.

Also, the adaptor 204 can be a passive connecting device, meaning that the adaptor 204 allows multiple data I/O pins of the DUT to simultaneously provide respective output signals to a single I/O channel of the tester 200 without the need for a selector unit or the like to select between I/O signals on the DUT and adaptor side. As shown in FIG. 3, the adaptor 204 can include a plurality of nodes, including nodes N1-N8. Each of nodes N1-N8 serves as a connection point for combining signals output from multiple data I/O pins of the DUT 202 into a compound signal that is provided to a respective I/O channel of the tester 200. For example, node N1 combines signals from data I/O pins D0 and D8 to produce a compound signal that is provided to I/O channel 1 of the tester 200, node N2 combines signals from data I/O pins D1 and D9 to produce a compound signal that is provided to I/O channel 2 of the tester 200, and so on.

Compared to the configuration shown in FIG. 1, the configuration shown in FIGS. 3 and 4 allows for testing one DUT 202 using half as many I/O channels of the tester 200. So, for example, if the tester 200 is similar to the tester 100 in that the tester 200 also has 640 I/O channels, and each DUT 202 has 16 data I/O pins, a maximum of 80 DUT's can be tested in parallel.

A testing process will next be described that allows for each I/O channel of a semiconductor memory tester to be connected to respective groups of data I/O pins of a DUT, for example as shown in FIGS. 3 and 4, which thereby allows for increased parallel testing capacity for existing semiconductor testers. Such increased capacity advantageously allows for faster and more cost-efficient testing of semiconductor memory devices.

Figure 5A:
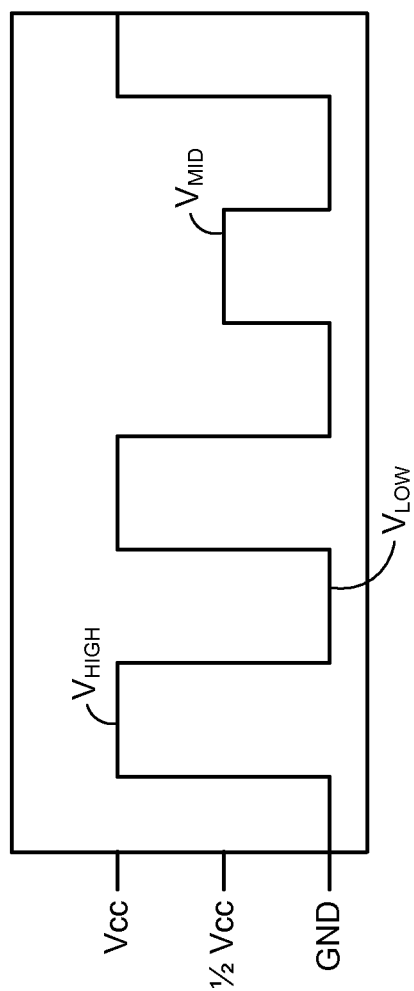
FIGS. 5A and 5B show voltage levels associated with a method of testing a semiconductor memory device using the configuration shown in FIGS. 3 and 4.
Figure 5B:
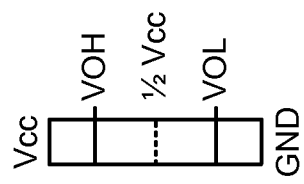

Turning next to FIGS. 5A and 5B, an embodiment of a method for testing semiconductor devices using a connection configuration as shown in FIGS. 3 and 4 will be described. FIG. 5A shows examples of resulting waveforms as received by I/O channels of the tester 200. For example, the signals shown in FIG. 5A can be examples of voltage levels that can be received at I/O channel 1 of the tester 200 from the combination of the outputs of the two I/O pins D(0) and D(8) of DUT 202.

Region $V_{HIGH}$ is a voltage level approximately equal to Vcc and corresponds to a voltage level that is received by the tester 200 whenever D(n)=data "1" output and D(n+8)=data "1" output. Region $V_{LOW}$ is a voltage level approximately equal to ground (GND) and corresponds to a voltage level that is received by the tester 200 whenever D(n)=data "0" output and D(n+8)=data "0" output. Region $V_{MID}$ is a voltage level approximately equal to ½ Vcc and corresponds to a voltage level that is received by the tester 200 whenever D(n)=data "1" output and D(n+8)=data "0" output, or whenever D(n)=data "0" output and D(n+8)=data "1" output.

The tester settings voltage output high (VOH) and voltage output low (VOL) levels can be set for the tester 200 to determine whether the testing result is a pass or fail. As shown in FIG. 5B, the VOH level can be set to a voltage level that is between Vcc and ½ Vcc, and the VOL level can be set to a voltage level that is between ½ Vcc and GND. Using the VOH and VOL settings shown in FIG. 5B, the tester 200 can be used to determine whether the DUT 202 is operating properly (Pass) or improperly (Fail).

FIGS. 6A-6D show four possible testing procedures using the configuration shown in FIGS. 2-5B. For convenience, the processes shown in FIGS. 6A-6D and described below refer to data I/O pins D(n) and D(n+8); however, the processes apply equally to alternative configurations such as those described above wherein each I/O channel of the tester 200 is connected to a pair of data I/O pins D(n) and D(15−n) or to a pair of data I/O pins D(n) and D(m).

Figure 6A:
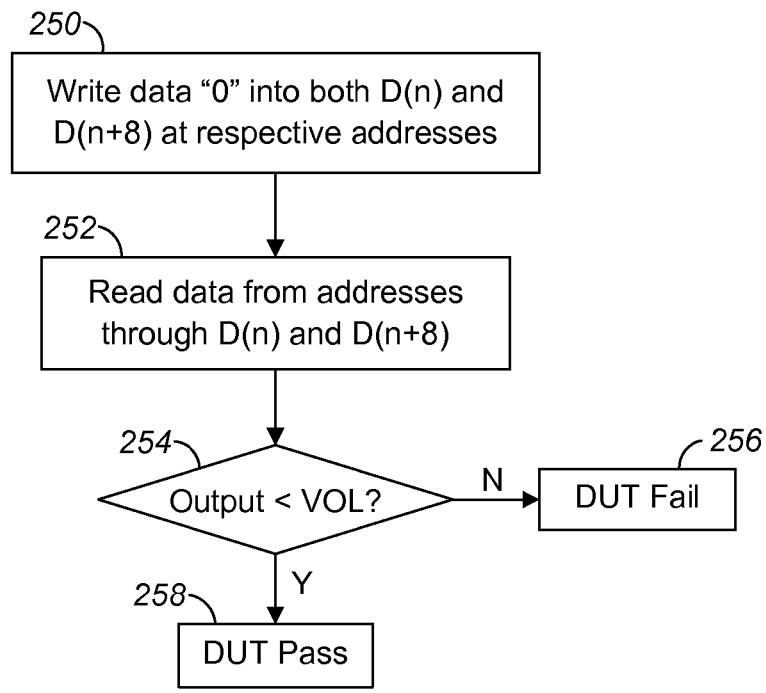
FIGS. 6A-6D show a flowcharts of a processes for testing a semiconductor memory device using the configuration shown in FIGS. 3 and 4.

FIG. 6A shows a first testing procedure where the same test data "0" is written to respective memory cells through data I/O pins D(n) and D(n+8) and subsequently read in order to determine whether the memory device is operating properly. Block 250 shows the writing of test data "0" to the DUT 202 from the tester 200. More specifically, each I/O channel of the tester 200 writes test data "0" through a respective pair of data I/O pins D(n) and D(n+8) to memory cells at respective addresses. That is, the test data "0" is written through data I/O pin D(n) to a first memory cell and the test data "0" is written through data I/O pin D(n+8) to a second memory cell, where the first and second memory cells are selected according to address data separately supplied to the DUT 202. In some embodiments, the tester 200 can sequentially issue separate write data such that the test data "0" is first written to a first memory cell associated with data I/O pin D(n), and then the test data "0" is written to a second memory cell associated with data I/O pin D(n+8), or vice-versa, while address data for the first and second memory cells is separately and synchronously provided to the DUT 202.

In some embodiments, the DUT 202 can include a test mode where each data I/O pin D(n) and D(n+8) can write and/or read test data to/from multiple memory cells, for example according to a test mode data compression system within the DUT 202. The process shown in FIG. 6A (as well as the processes shown in FIGS. 6B-6D) can be applied equally to such DUT's by writing and reading test data to and from respective groups of memory cells, where each group of memory cells is in communication with a respective one of data I/O pins D(n) and D(n+8).

At block 252, the tester 200 reads the previously written test data (the test data written at block 250) from the DUT 202. More specifically, each I/O channel of the tester 200 reads previously written test data through a respective pair of data I/O pins D(n) and D(n+8) from the same memory cells that were addressed at block 250. That is, data is simultaneously read through both data I/O pins D(n) and D(n+8) from the first and second memory cells.

At block 254, the tester 200 compares the VOL level to the output voltage level from the combined pair of pins D(n) and D(n+8) as received by the respective I/O channel of the tester 200. If the output voltage level is less than the VOL level, then the tester 200 interprets this result to mean that test data "0" was successfully written to, and subsequently read from, the DUT 202. If this result is obtained for all of the memory cells of the DUT 202, then the DUT 202 is considered to have passed the test (block 258). Otherwise, if the output voltage level is not less than the VOL level, then the tester interprets this result to mean that the test data "0" was not successfully written to, and subsequently read from, at least one memory cell of the DUT 202. In such as case, the DUT 202 is considered to have failed the test (block 256).

Figure 6B:
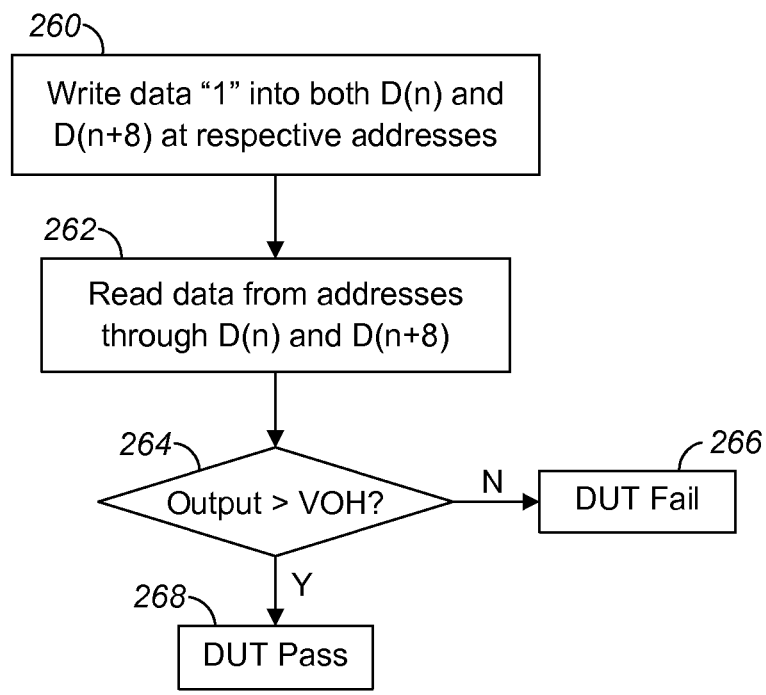

FIG. 6B shows a second testing procedure where the same test data "1" is written to respective memory cells through data I/O pins D(n) and D(n+8) and subsequently read in order to determine whether the memory device is operating properly. Block 260 shows the writing of test data "1" to the DUT 202 from the tester 200. More specifically, each I/O channel of the tester 200 writes test data "1" through a respective pair of data I/O pins D(n) and D(n+8) to memory cells at respective addresses. That is, the test data "1" is written through data I/O pin D(n) to a first memory cell and the test data "1" is written through data I/O pin D(n+8) to a second memory cell, where the first and second memory cells are selected according to address data separately supplied to the DUT 202. In some embodiments, the tester 200 can sequentially issue separate write data such that the test data "1" is first written to a first memory cell associated with data I/O pin D(n), and then the test data "1" is written to a second memory cell associated with data I/O pin D(n+8), or vice-versa, while address data for the first and second memory cells is separately and synchronously provided to the DUT 202.

In some embodiments, the DUT 202 can include a test mode where each data I/O pin D(n) and D(n+8) can write and/or read test data to/from multiple memory cells, for example according to a test mode data compression system within the DUT 202. The process shown in FIG. 6B can be applied equally to such DUT's by writing and reading test data to and from respective groups of memory cells, where each group of memory cells is in communication with a respective one of data I/O pins D(n) and D(n+8).

At block 262, the tester 200 reads previously written test data (the test data written at block 260) from the DUT 202. More specifically, each I/O channel of the tester 200 reads the previously written test data through a respective pair of data I/O pins D(n) and D(n+8) from the same memory cells that were addressed at block 260. That is, the previously written test data is simultaneously read through both data I/O pins D(n) and D(n+8) from the first and second memory cells.

At block 264, the tester 200 compares the VOH level to the output voltage level from the combined pair of pins D(n) and D(n+8) as received by the respective I/O channel of the tester 200. If the output voltage level is greater than the VOH level, then the tester 200 interprets this result to mean that the test data "1" was successfully written to, and subsequently read from, the DUT 202. If this result is obtained for all of the memory cells of the DUT 202, then the DUT 202 is considered to have passed the test (block 268). Otherwise, if the output voltage level is not greater than the VOH level, then the tester interprets this result to mean that the test data "1" was not successfully written to, and subsequently read from, at least one memory cell of the DUT 202. In such as case, the DUT 202 is considered to have failed the test (block 266).

Figure 6C:
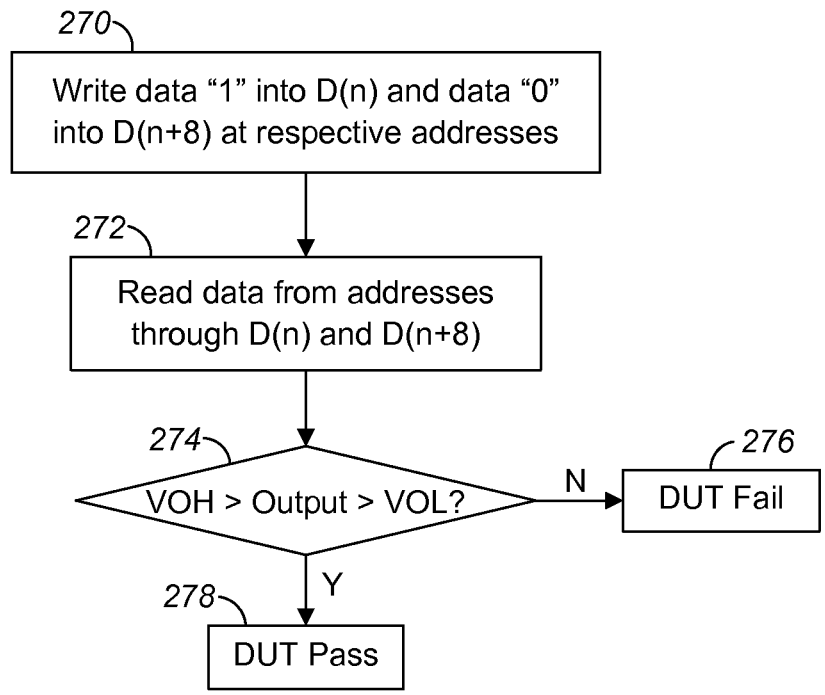

FIG. 6C shows a third testing procedure where different test data "0" and "1" are written to respective memory cells through data I/O pins D(n) and D(n+8) and subsequently read in order to determine whether the memory device is operating properly. Block 270 shows the writing of test data "1" and "0" to the DUT 202 from the tester 200. More specifically, each I/O channel of the tester 200 writes test data "1" through a data I/O pin D(n) and writes test data "0" through a data I/O pin D(n+8) to memory cells at respective addresses. That is, the test data "1" is written through data I/O pin D(n) to a first memory cell and the test data "0" is written through data I/O pin D(n+8) to a second memory cell, where the first and second memory cells are selected according to address data separately supplied to the DUT 202. In some embodiments, the tester 200 can sequentially issue separate write data such that the test data "1" is first written to a first memory cell associated with data I/O pin D(n), and then the test data "0" is written to a second memory cell associated with data I/O pin D(n+8), or vice-versa, while address data for the first and second memory cells is separately and synchronously provided to the DUT 202.

In some embodiments, the DUT 202 can include a test mode where each data I/O pin D(n) and D(n+8) can write and/or read test data to/from multiple memory cells, for example according to a test mode data compression system within the DUT 202. The process shown in FIG. 6C can be applied equally to such DUT's by writing and reading test data to and from respective groups of memory cells, where each group of memory cells is in communication with a respective one of data I/O pins D(n) and D(n+8).

At block 272, the tester 200 reads the previously written test data (the test data written at block 270) from the DUT 202. More specifically, each I/O channel of the tester 200 reads the previously written test data through a respective pair of data I/O pins D(n) and D(n+8) from the same memory cells that were addressed at block 270. That is, the previously written test data is simultaneously read through both data I/O pins D(n) and D(n+8) from the first and second memory cells.

At block 274, the tester 200 compares the VOH level and the VOL level to the output voltage level from the combined pair of pins D(n) and D(n+8) as received by the respective I/O channel of the tester 200. If the output voltage level is between the VOH level and the VOL level (i.e., less than the VOH level, but greater than the VOL level), then the tester 200 interprets this result to mean that the test data "0" and "1" were successfully written to, and subsequently read from, the DUT 202. If this result is obtained for all of the memory cells of the DUT 202, then the DUT 202 is considered to have passed the test (block 278). Otherwise, if the output voltage level is not between the VOH and VOL levels, then the tester interprets this result to mean that the test data "0" and "1" were not successfully written to, and subsequently read from, memory cells of the DUT 202. In such as case, the DUT 202 is considered to have failed the test (block 276).

Figure 6D:
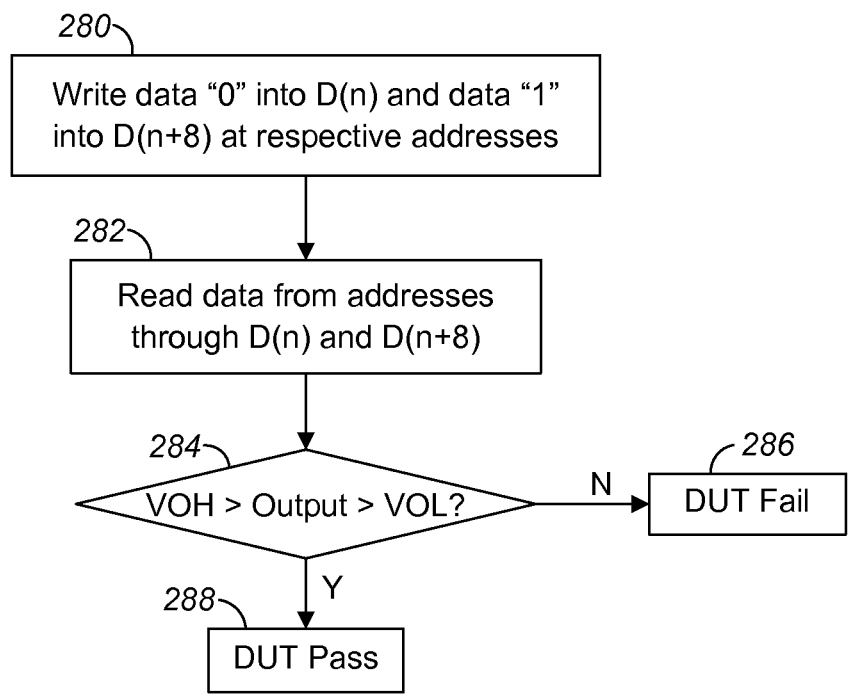

FIG. 6D shows a fourth testing procedure where different test data "1" and "0" are written to respective memory cells through data I/O pins D(n) and D(n+8) and subsequently read in order to determine whether the memory device is operating properly. Block 280 shows the writing of test data "0" and "1" to the DUT 202 from the tester 200. More specifically, each I/O channel of the tester 200 writes test data "0" through a data I/O pin D(n) and writes test data "1" through a data I/O pin D(n+8) to memory cells at respective addresses. That is, the test data "0" is written through data I/O pin D(n) to a first memory cell and the test data "1" is written through data I/O pin D(n+8) to a second memory cell, where the first and second memory cells are selected according to address data separately supplied to the DUT 202. In some embodiments, the tester 200 can sequentially issue separate write data such that the test data "0" is first written to a first memory cell associated with data I/O pin D(n), and then the test data "1" is written to a second memory cell associated with data I/O pin D(n+8), or vice-versa, while address data for the first and second memory cells is separately and synchronously provided to the DUT 202.

In some embodiments, the DUT 202 can include a test mode where each data I/O pin D(n) and D(n+8) can write and/or read test data to/from multiple memory cells, for example according to a test mode data compression system within the DUT 202. The process shown in FIG. 6D can be applied equally to such DUT's by writing and reading test data to and from respective groups of memory cells, where each group of memory cells is in communication with a respective one of data I/O pins D(n) and D(n+8).

At block 282, the tester 200 reads the previously written test data (the test data written at block 280) from the DUT 202. More specifically, each I/O channel of the tester 200 reads the previously written test data through a respective pair of data I/O pins D(n) and D(n+8) from the same memory cells that were addressed at block 280. That is, the previously written test data is simultaneously read through both data I/O pins D(n) and D(n+8) from the first and second memory cells.

At block 284, the tester 200 compares the VOH level and the VOL level to the output voltage level from the combined pair of pins D(n) and D(n+8) as received by the respective I/O channel of the tester 200. If the output voltage level is between the VOH level and the VOL level (i.e., less than the VOH level, but greater than the VOL level), then the tester 200 interprets this result to mean that the test data "1" and "0" were successfully written to, and subsequently read from, the DUT 202. If this result is obtained for all of the memory cells of the DUT 202, then the DUT 202 is considered to have passed the test (block 288). Otherwise, if the output voltage level is not between the VOH and VOL levels, then the tester interprets this result to mean that the test data "1" and "0" were not successfully written to, and subsequently read from, memory cells of the DUT 202. In such as case, the DUT 202 is considered to have failed the test (block 286).

Testing systems and methods described herein can be used for a variety of semiconductor memory tests. For example, aspects of the present disclosure can be applied to wafer sorts, final tests, burn-in tests, and cycling tests by arranging the corresponding connections using an appropriately configured adaptor to fit the connection configurations of the DUT's. Also, testing systems and methods described herein can be used for testing of a variety of different types of semiconductor memory devices, including, for example, SRAM memory, NOR flash memory, Pseudo SRAM memory, and memory devices including features such as byte/word switchability, lower/higher byte control or lower/higher word control.

While the testing systems and methods disclosed herein with reference to FIGS. 2-6D have been primarily described with reference to connecting I/O channels of a tester to pairs of data I/O pins of a DUT, the scope of the present disclosure is not limited to such a configuration. Those skilled in the art will appreciate that the concepts can be extended to include connection of I/O channels of a tester to more than two data I/O pins of a DUT. For example, each I/O channel of a tester can be connected to 2N (where N is an integer equal to or greater than 1) data I/O pins of a DUT. Such alternative embodiments can include connecting two data I/O pins, four data I/O pins, eight data I/O pins, or more of a DUT together with an I/O channel of a tester in order to increase testing throughput. So, for example, if a DUT has 16 data I/O pins D(0) through D(15), each I/O channel of the tester can be assigned to be connected to a respective group of two, four, or eight of the data I/O pins of the DUT. As a more specific example, in an embodiment where each I/O channel of the tester is assigned to be connected to a respective group of four of the data I/O pins of the DUT, the connections can be made such that each I/O channel of the tester is connected to data I/O pins D(n), D(n+4), D(n+8), and D(n+12), where n=0 for a first I/O channel, n=1 for a second I/O channel, n=2 for a third I/O channel, and n=3 for a fourth I/O channel. Still further alternative connection configurations can be used without departing from the scope of the present disclosure.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:
1. A method of testing a semiconductor memory device, the semiconductor memory device including a plurality of data input/output (I/O) connections, the method comprising:
   reading previously written data from the semiconductor memory device simultaneously through at least two of the plurality of the data I/O connections, wherein signals from the at least two data I/O connections are combined to produce a compound output signal;
   comparing the compound output signal to a predetermined voltage level;

determining whether the semiconductor memory device is operating properly based on the comparison of the compound output signal to the predetermined voltage level; and wherein the comparing of the compound output signal to a predetermined voltage level includes comparing the compound output signal to a voltage output low (VOL) level and a voltage output high (VOH) level, and determining whether a voltage level of the compound output signal is in a range between the VOH level and the VOL level.

2. The method of claim 1, wherein the compound output signal is received by a single I/O channel of a tester.

3. The method of claim 1, wherein the reading includes combining the signals from the at least two data I/O connections at a node located within an adaptor to produce the compound output signal.

4. The method of claim 3, wherein the adaptor is disposed in series between the semiconductor memory device and a tester.

5. The method of claim 1, further comprising writing test data to the semiconductor memory device prior to the reading such that the reading of previously written data includes reading the thus written test data.

6. The method of claim 5, wherein the writing of test data includes writing the same data to at least two memory cells via the at least two data I/O connections, respectively.

7. The method of claim 5, wherein the writing of test data includes writing different data to at least two memory cells via the at least two data I/O connections, respectively.

8. The method of claim 6, wherein the comparing of the compound output signal to a predetermined voltage level includes comparing the compound output signal to a voltage output high (VOH) level, and determining whether a voltage level of the compound output signal is greater than the VOH level.

9. The method of claim 6, wherein the comparing of the compound output signal to a predetermined voltage level includes comparing the compound output signal to a voltage output low (VOL) level, and determining whether a voltage level of the compound output signal is less than the VOL level.

10. A method of testing a semiconductor memory device, the semiconductor memory device including a plurality of data input/output (I/O) connections, the method comprising:

writing test data from an I/O channel of a tester to memory cells of the semiconductor memory device via first and second data I/O connections of the plurality of data I/O connections of the semiconductor memory device, wherein the first and second data I/O connections are connected to the I/O channel of the tester through a node disposed external to the semiconductor memory device and the tester;

reading the test data from the semiconductor memory device simultaneously through the first and second data I/O connections, wherein signals from the first and second data I/O connections are combined at the node to produce a compound output signal;

determining whether the semiconductor memory device is operating properly based on a comparison of the compound output signal to a predetermined voltage level; and comparing the compound output signal to the predetermined voltage level, wherein the predetermined voltage level is a voltage output low (VOL) level, and further comparing the compound output signal to a predetermined voltage output high (VOH) level, and determining whether a voltage level of the compound output signal is in a range between the VOH level and the VOL level.

11. The method of claim 10, wherein the compound output signal is received by the I/O channel of the tester.

12. The method of claim 10, wherein the writing of test data includes writing different data to first and second memory cells via the first and second data I/O connections, respectively.

13. The method of claim 10, wherein the writing of test data further comprises writing test data from the I/O channel of the tester to memory cells of the semiconductor memory device via third and fourth data I/O connections of the plurality of data I/O connections of the semiconductor memory device, wherein the first, second, third, and fourth data I/O connections are connected to the I/O channel of the tester through the node disposed external to the semiconductor memory device and the tester; and wherein the reading of the test data further comprises reading the test data from the semiconductor memory device simultaneously through the first, second, third, and fourth data I/O connections, wherein signals from the first, second, third, and fourth data I/O connections are combined at the node to produce a compound output signal.

14. The method of claim 10, wherein the node is located within an adaptor.

15. The method of claim 14, wherein the adaptor is disposed in series between the semiconductor memory device and the tester.

16. The method of claim 10, wherein the writing of test data includes writing the same data to first and second memory cells via the first and second data I/O connections, respectively.

17. The method of claim 16, further comprising comparing the compound output signal to the predetermined voltage level, wherein the predetermined voltage level is a voltage output high (VOH) level, and determining whether a voltage level of the compound output signal is greater than the VOH level.

18. The method of claim 16, further comprising comparing the compound output signal to the predetermined voltage level, wherein the predetermined voltage level is a voltage output low (VOL) level, and determining whether a voltage level of the compound output signal is less than the VOL level.

* * * * *